(12) United States Patent
Short

(10) Patent No.: US 8,927,911 B2
(45) Date of Patent: Jan. 6, 2015

(54) ENHANCED BUS BAR SYSTEM FOR AIRCRAFT TRANSPARENCIES

(75) Inventor: John R. Short, Madison, AL (US)

(73) Assignee: PPG Industries Ohio, Inc., Cleveland, OH (US)

( * ) Notice: Subject to any disclaimer, the term of this patent is extended or adjusted under 35 U.S.C. 154(b) by 251 days.

(21) Appl. No.: 12/839,523

(22) Filed: Jul. 20, 2010

(65) Prior Publication Data

US 2011/0017487 A1  Jan. 27, 2011

Related U.S. Application Data

(60) Provisional application No. 61/227,119, filed on Jul. 21, 2009.

(51) Int. Cl.
*H05B 3/08* (2006.01)
*H05B 3/84* (2006.01)

(52) U.S. Cl.
CPC ............ *H05B 3/84* (2013.01); *H05B 2203/016* (2013.01)
USPC ........................................................ 219/541

(58) Field of Classification Search
USPC ................ 219/541, 528, 529, 535, 542, 549; 52/171.2; 338/306–309; 174/50, 72 B, 174/71 B, 88 B, 70 B; 361/611, 624, 637, 361/648
See application file for complete search history.

(56) References Cited

U.S. PATENT DOCUMENTS

| | | |
|---|---|---|
| 3,529,074 A | 9/1970 | Lewis |
| 3,995,140 A | 11/1976 | Kuiff et al. |
| 4,213,028 A * | 7/1980 | Wolf .............................. 219/203 |
| 4,610,771 A | 9/1986 | Gillery |
| 4,716,086 A | 12/1987 | Gillery et al. |
| 4,746,347 A | 5/1988 | Sensi |
| 4,792,536 A | 12/1988 | Pecoraro et al. |
| 4,806,220 A | 2/1989 | Finley |
| 4,820,902 A | 4/1989 | Gillery |
| 4,834,857 A | 5/1989 | Gillery |
| 4,898,789 A | 2/1990 | Finley |
| 4,898,790 A | 2/1990 | Finley |
| 4,902,580 A | 2/1990 | Gillery |
| 4,918,288 A | 4/1990 | Carter et al. |
| 4,939,348 A | 7/1990 | Criss |
| 4,948,677 A | 8/1990 | Gillery |

(Continued)

FOREIGN PATENT DOCUMENTS

GB   2 127 659 A   4/1984
WO   2004/010738 A2   1/2004

OTHER PUBLICATIONS

International Search Report, PCT/US2010/042517, dated Nov. 15, 2010.

*Primary Examiner* — Boris Chervinsky
*Assistant Examiner* — Pete Lee
(74) *Attorney, Agent, or Firm* — Andrew C. Siminerio

(57) ABSTRACT

A bus bar system includes a non-conductive substrate having a major surface. At least one conductive bus bar is formed over at least a portion of the major surface. A conductive coating is formed over at least a portion of the bus bar and the major surface. An electrically conductive adhesive, such as an isotropically conductive tape or film, is applied over at least a portion of the film/bus bar junction. The system can optionally include a conductive metallic foil adhered to the isotropically conductive adhesive.

16 Claims, 2 Drawing Sheets

(56) References Cited

U.S. PATENT DOCUMENTS

| | | |
|---|---|---|
| 5,028,759 A | 7/1991 | Finley |
| 5,030,593 A | 7/1991 | Heithoff |
| 5,030,594 A | 7/1991 | Heithoff |
| 5,059,295 A | 10/1991 | Finley |
| 5,070,230 A * | 12/1991 | Osada et al. ............... 219/203 |
| 5,240,886 A | 8/1993 | Gulotta et al. |
| 5,385,872 A | 1/1995 | Gulotta et al. |
| 5,393,593 A | 2/1995 | Gulotta et al. |
| 5,653,903 A | 8/1997 | Pinchok, Jr. et al. |
| 5,821,001 A | 10/1998 | Arbab et al. |
| 5,824,994 A | 10/1998 | Noda et al. |
| 6,870,134 B2 * | 3/2005 | Sol et al. .................. 219/203 |
| 6,953,911 B2 * | 10/2005 | Bartrug et al. ............. 219/203 |
| 7,132,625 B2 | 11/2006 | Voeltzel |
| 7,223,939 B2 * | 5/2007 | Hoepfner et al. ........... 219/203 |
| 7,362,491 B2 * | 4/2008 | Busick et al. .............. 359/265 |
| 7,847,745 B2 * | 12/2010 | Martin ....................... 343/713 |
| 8,173,906 B2 * | 5/2012 | Bedinger et al. ........... 174/258 |
| 2003/0146199 A1 | 8/2003 | Sol et al. |
| 2003/0180547 A1 | 9/2003 | Buhay et al. |
| 2006/0186105 A1 | 8/2006 | Voeltzel et al. |
| 2008/0246748 A1 * | 10/2008 | Cassidy et al. ............. 345/205 |

* cited by examiner

ENHANCED BUS BAR SYSTEM FOR AIRCRAFT TRANSPARENCIES

CROSS REFERENCE TO RELATED APPLICATION

This application claims the benefit of U.S. Provisional Application No. 61/227,119 entitled "Enhanced Bus Bar System For Aircraft Transparencies", filed Jul. 21, 2009, herein incorporated by reference in its entirety.

BACKGROUND OF THE INVENTION

1. Field of the Invention

This invention relates generally to bus bar systems and, in one particular embodiment, to a bus bar system particularly suited for an aircraft transparency.

2. Technical Considerations

It is known to apply a conductive coating to a vehicle transparency, such as a vehicle windshield or window. When electrical current is supplied to the conductive coating, the coating temperature increases, which can provide deicing or defogging for the transparency. Electrical current is typically supplied to the conductive coating via one or more "bus bars" connected to a source of electricity. These bus bars can be metal or ceramic strips applied to a surface of the transparency and in contact with the conductive coating. In one known configuration, conductive ceramic bus bars are formed on a glass substrate, typically near the periphery of the substrate. The conductive coating is then applied over the surface of the substrate, including the bus bar. Electrical current supplied to the bus bar is transferred to the conductive coating to increase the coating temperature.

While this known system provides advantages over non-coated transparencies, there are still problems associated with this system. For example, the difference in thickness between the conductive coating and the bus bar may be as high as 1:200 to 1:400. Therefore, when the relatively thin conductive coating is formed over the much thicker bus bar, the coating formed at the transitional edges of the bus bar (i.e. the "film/bus bar junction") can be thin, weak, or can contain discontinuities. These film/bus bar junction defects, in a worse case scenario, could lead to gaps or holes in the coating at the film/bus bar junction that can result in non-uniform transfer of electrical current and/or localized excessive current flow leading to resistance heating followed by arcing sufficient to damage the substrate.

Therefore, it would be advantageous to provide a bus bar system that eliminates or reduces at least some of the problems associated with conventional bus bar systems.

SUMMARY OF THE INVENTION

A bus bar system of the invention comprises a non-conductive substrate having a major surface. At least one conductive bus bar is located over at least a portion of the major surface. A conductive coating is located over at least a portion of the bus bar and over at least a portion of the major surface. An electrically conductive adhesive, e.g., an isotropically conductive adhesive, such as an isotropically conductive tape or film, is located over at least a portion of the film/bus bar junction. The system can optionally include a conductive metallic foil adhered to the isotropically conductive adhesive.

Another bus bar system comprises a non-conductive substrate having a major surface. At least one bus bar is located over at least a portion of the major surface. A conductive coating is located over at least a portion of the bus bar and over at least a portion of the major surface. A first electrically conductive adhesive, e.g., an isotropically conductive adhesive, such as an isotropically conductive tape or film, is located over at least a portion of the conductive coating overlying the bus bar. A conductive braid is located over the first conductive adhesive. A second electrically conductive adhesive, e.g., an isotropically conductive adhesive, such as an isotropically conductive tape or film, is located over at least a portion of the braid and the first conductive adhesive. A conductive metallic foil is located over at least a portion of the second conductive adhesive, the braid, and the first conductive adhesive.

A further bus bar system of the invention comprises a non-conductive substrate having a major surface. A conductive coating is located over at least a portion of the major surface. An electrically conductive adhesive, e.g., an isotropically conductive adhesive, such as an isotropically conductive tape or film, is located over at least a portion of the conductive coating. A conductive metallic member, such as a metallic foil or metallic braid, is attached to the conductive adhesive. The conductive adhesive and the metallic member form the bus bar for the system.

A method of making a bus bar system comprises obtaining a non-conductive substrate having a major surface, with at least one conductive bus bar located over at least a portion of the major surface and a conductive coating located over at least a portion of the bus bar and over at least a portion of the major surface. The method includes applying an electrically conductive adhesive, e.g., an isotropically conductive adhesive, such as an isotropically conductive tape or film, over at least a portion of the film/bus bar junction.

Another method of making a bus bar system includes adhering a piece of metallic foil to a piece of isotropically conductive tape. The foil covered tape is cut to desired dimensions. The foil covered tape can be cut to be larger than the dimensions of the bus bar to which it will be attached. The method includes adhering the foil covered tape over at least a portion of the film/bus bar junction.

BRIEF DESCRIPTION OF THE DRAWINGS

The invention may be more completely understood in consideration of the following drawings wherein like reference numbers identify like parts throughout.

DESCRIPTION OF THE PREFERRED EMBODIMENTS

Figure 1:
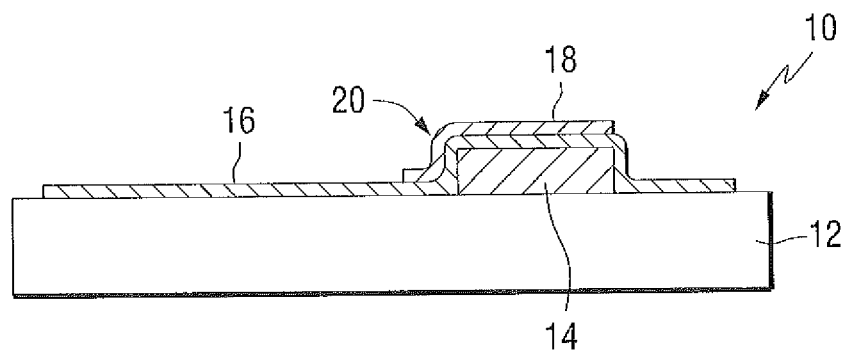
FIG. 1 is a side, sectional view (not to scale) of a bus bar system incorporating features of the invention.

As used herein, spatial or directional terms, such as "left", "right", "inner", "outer", "above", "below", and the like, relate to the invention as it is shown in the drawing figures. However, it is to be understood that the invention can assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 3.3, 4.7 to 7.5, 5.5 to 10, and the like. Further, as used herein, the terms "formed over", "deposited over", or "provided over" mean formed, deposited, or provided on but not necessarily in direct contact with the surface. For example, a coating layer "formed over" a substrate does not preclude the presence of one or more other coating layers or films of the same or different composition located between the formed coating layer and the substrate. Additionally, all documents, such as but not limited to issued patents and patent applications, referred to herein are to be considered to be "incorporated by reference" in their entirety. As used herein, the terms "polymer" or "polymeric" include oligomers, homopolymers, copolymers, and terpolymers, e.g., polymers formed from two or more types of monomers or polymers. The terms "visible region" or "visible light" refer to electromagnetic radiation having a wavelength in the range of 380 nm to 760 nm. The terms "infrared region" or "infrared radiation" refer to electromagnetic radiation having a wavelength in the range of greater than 760 nm to 100,000 nm. The terms "ultraviolet region" or "ultraviolet radiation" mean electromagnetic energy having a wavelength in the range of 300 nm to less than 380 nm.

In the following description, only a portion of a typical heated transparency is illustrated for ease of discussion of the bus bar system of the invention. As will be appreciated by one skilled in the art, a conventional heated transparency can include a first substrate connected to a second substrate by a polymeric layer, with the bus bar system located between the two substrates. The bus bar is in contact with a source of electrical power. Examples of conventional heated transparencies are disclosed in U.S. Pat. Nos. 4,820,902; 4,939,348; and 5,824,994 and will be understood by those skilled in the art.

A first bus bar system 10 is shown in FIG. 1 of the drawings. The bus bar system 10 is provided on a substrate 12 having a major surface. At least one bus bar 14 is formed over at least a portion of the substrate 12, such as around a portion at or near the periphery of the major surface of the substrate 12. In FIG. 1, the right side of the figure is the outer (upper) edge of the bus bar 14 and the left side of the figure is the bottom (inner) edge of the bus bar 14. However, this is just for purposes of illustration and the bus bar 14 could be present at any desired location. An electrically conductive coating 16 is formed over at least a portion of the major surface of the substrate 12, including over at least a portion of the bus bar 14. However, unlike conventional bus bar systems, the bus bar system 10 of the invention includes an electrically conductive adhesive 18 having isotropic conductance. By "isotropic conductance" or "isotropically conductive" is meant having electrical conductance in the x, y, and z directions. The isotropically conductive adhesive 18 is applied over at least a portion of the film/bus bar junction 20. By "film/bus bar junction" is meant the region where the coating 16 transitions from the substrate surface to the leading edge (i.e. inner edge) of the bus bar 14.

In the broad practice of the invention, the substrate 12 can include any desired material having any desired characteristics. For example, the substrate 12 can be transparent or translucent to visible light. By "transparent" is meant having a transmission of greater than 0% up to 100% in a desired wavelength range, such as visible light. Alternatively, the substrate 12 can be translucent. By "translucent" is meant allowing electromagnetic radiation (e.g., visible light) to be transmitted but diffusing or scattering this radiation. Examples of suitable materials for the substrate 12 include, but are not limited to, thermoplastic, thermoset, or elastomeric polymeric materials, glasses, ceramics, and metals or metal alloys, and combinations, composites, or mixtures thereof. Specific examples of suitable materials include, but are not limited to, plastic substrates (such as acrylic polymers, such as polyacrylates; polyalkylmethacrylates, such as polymethylmethacrylates, polyethylmethacrylates, polypropylmethacrylates, and the like; polyurethanes; polycarbonates; polyalkylterephthalates, such as polyethyleneterephthalate (PET), polypropyleneterephthalates, polybutyleneterephthalates, and the like; polysiloxane-containing polymers; or copolymers of any monomers for preparing these, or any mixtures thereof); ceramic substrates; glass substrates; or mixtures or combinations of any of the above. For example, the substrate 12 can include conventional soda-lime-silicate glass, borosilicate glass, or leaded glass. The glass can be clear glass. By "clear glass" is meant non-tinted or non-colored glass. Alternatively, the glass can be tinted or otherwise colored glass. The glass can be annealed or heat-treated glass. As used herein, the term "heat treated" means tempered, bent, heat strengthened, or laminated. The glass can be of any type, such as conventional float glass, and can be of any composition having any optical properties, e.g., any value of visible transmission, ultraviolet transmission, infrared transmission, and/or total solar energy transmission. The substrate 12 can be, for example, clear float glass or can be tinted or colored glass. Although not limiting to the invention, examples of glass suitable for the substrate 12 are described in U.S. Pat. Nos. 4,746,347; 4,792,536; 5,030,593; 5,030,594; 5,240,886; 5,385,872; 5,393,593; 5,030,593; and 5,030,594. Examples of glass that can be used for the practice of the invention include, but are not limited to, Starphire®, Solarphire®, Solarphire® PV, Solargreen®, Solextra®, GL-20®, GL-35™, Solarbronze®, CLEAR, and Solargray® glass, all commercially available from PPG Industries Inc. of Pittsburgh, Pa.

The substrate 12 can be of any desired dimensions, e.g., length, width, shape, or thickness. In one exemplary embodiment, the substrate 12 can be greater than 0 mm up to 10 mm thick, such as 1 mm to 10 mm thick, e.g., 1 mm to 5 mm thick, e.g., less than 4 mm thick, e.g., 3 mm to 3.5 mm thick, e.g., 3.2 mm thick. Additionally, the substrate 12 can be of any desired shape, such as flat, curved, parabolic-shaped, or the like. The substrate 12 can have a high visible light transmission at a reference wavelength of 550 nanometers (nm) and a reference thickness of 3.2 mm. By "high visible light transmission" is meant visible light transmission at 550 nm of greater than or equal to 85%, such as greater than or equal to 87%, such as greater than or equal to 90%, such as greater than or equal to 91%, such as greater than or equal to 92%, such as greater than or equal to 93%, such as greater than or equal to 95%, at 3.2 mm reference thickness for the substrate.

The bus bar 14 can be of any conventional type. For example, the bus bar 14 can be a conventional ceramic bus bar incorporating a conductive metal, such as silver. Alternatively, the bus bar 14 can be a metallic strip.

The conductive coating 16 can be a conventional conductive coating, such as indium tin oxide. Or, the conductive coating 16 can be a functional coating including one or more metallic films positioned between pairs of dielectric layers. The conductive coating 16 can be a heat and/or radiation reflecting coating and can have one or more coating layers or films of the same or different composition and/or functionality. As used herein, the term "film" refers to a coating region of a desired or selected coating composition. A "layer" can comprise one or more "films" and a "coating" or "coating stack" can comprise one or more "layers". For example, the conductive coating 16 can be a single layer coating or a multi-layer coating and can include one or more metals, non-metals, semi-metals, semiconductors, and/or alloys, compounds, compositions, combinations, or blends thereof. For example, the conductive coating 16 can be a single layer metal oxide coating, a multiple layer metal oxide coating, a non-metal oxide coating, a metallic nitride or oxynitride coating, a non-metallic nitride or oxynitride coating, or a multiple layer coating comprising one or more of any of the above materials. For example, the conductive coating 16 can be a doped metal oxide coating. An electrically conductive coating used to make heatable windows is disclosed in U.S. Pat. Nos. 5,653,903 and 5,028,759. Likewise, the conductive coating 16 can be a conductive, solar control coating. As used herein, the term "solar control coating" refers to a coating comprised of one or more layers or films that affect the solar properties of the coated article, such as but not limited to the amount of solar radiation, for example, visible, infrared, or ultraviolet radiation, reflected from, absorbed by, or passing through the coated article, shading coefficient, emissivity, etc. The solar control coating can block, absorb or filter selected portions of the solar spectrum, such as but not limited to the IR, UV, and/or visible spectrums. Examples of solar control coatings that can be used in the practice of the invention are found, for example but not to be considered as limiting, in U.S. Pat. Nos. 4,898,789; 5,821,001; 4,716,086; 4,610,771; 4,902,580; 4,716,086; 4,806,220; 4,898,790; 4,834,857; 4,948,677; 5,059,295; and 5,028,759. Non-limiting examples of suitable conductive coatings 30 for use with the invention are commercially available from PPG Industries, Inc. of Pittsburgh, Pa. under the SUNGATE® and SOLARBAN® families of coatings. Such coatings typically include one or more antireflective coating films comprising dielectric or anti-reflective materials, such as metal oxides or oxides of metal alloys, which are transparent to visible light. The conductive coating 16 can also include one or more infrared reflective films comprising a reflective metal, e.g., a noble metal such as gold, copper or silver, or combinations or alloys thereof, and can further comprise a primer film or barrier film, such as titanium, as is known in the art, located over and/or under the metal reflective layer. The conductive coating 16 can have any desired number of infrared reflective films, such as but not limited to 1 to 5 infrared reflective films. In one non-limiting embodiment, the coating 16 can have 1 or more silver layers, e.g., 2 or more silver layers, e.g., 3 or more silver layers, such as 5 or more silver layers. A non-limiting example of a suitable coating having three silver layers is disclosed in U.S. Patent Publication No. 2003/0180547 A1.

The conductive coating 16 can be deposited by any conventional method, such as but not limited to conventional chemical vapor deposition (CVD) and/or physical vapor deposition (PVD) methods. Examples of CVD processes include spray pyrolysis. Examples of PVD processes include electron beam evaporation and vacuum sputtering (such as magnetron sputter vapor deposition (MSVD)). Other coating methods could also be used, such as but not limited to sol-gel deposition. In one non-limiting embodiment, the conductive coating 16 can be deposited by MSVD.

As will be appreciated by one skilled in the art, due to the thickness difference between the relatively thick bus bar 14 and the relatively thin conductive coating 16, gaps or thin spots can be present in the coating 16 when the coating is deposited at the film/bus bar junction. The isotropically conductive adhesive 18 can be, for example, an isotropically conductive tape or film. Examples of suitable isotropically conductive tapes include 3M™ XYZ-Axis Electrically Conductive Adhesive Transfer Tapes 9713, 9712, and 9719, commercially available from 3M Corporation. An example of a suitable conductive film includes Emerson & Cuming CF3350 epoxy film adhesive, commercially available from Emerson & Cuming of Billerica, Mass. The adhesive 18 can have a surface resistance equal to or greater than the surface resistance of the conductive coating 16.

The use of the isotropically conductive adhesive 18, such an isotropically conductive tape, provides numerous advantages over prior systems. For example, the application of an isotropically conductive tape is relatively rapid and easy to perform. The tape is flexible and conforms to irregular surfaces. There is no need to "cure" the applied tape and the tape is sufficiently conductive to bridge missing or damaged film portions at the junction between the edge of the bus bar 14 and the overlying conductive coating 16. The tape also provides additional mechanical and/or chemical protection to the underlying bus bar 14 and coating 16.

Figure 2:
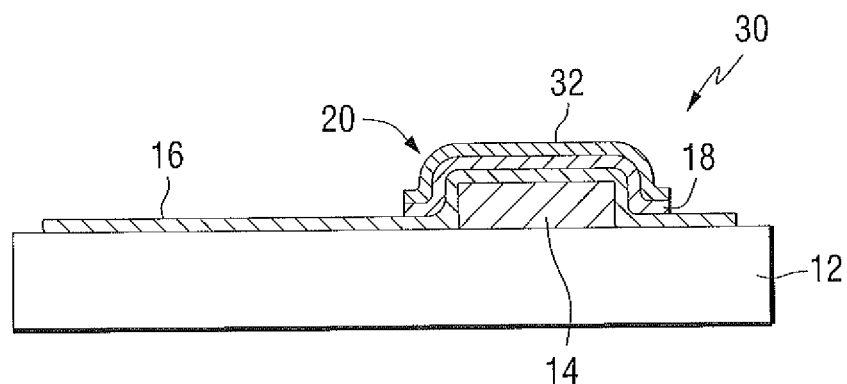
FIG. 2 is a side, sectional view (not to scale) of another bus bar system of the invention.
Figure 4:
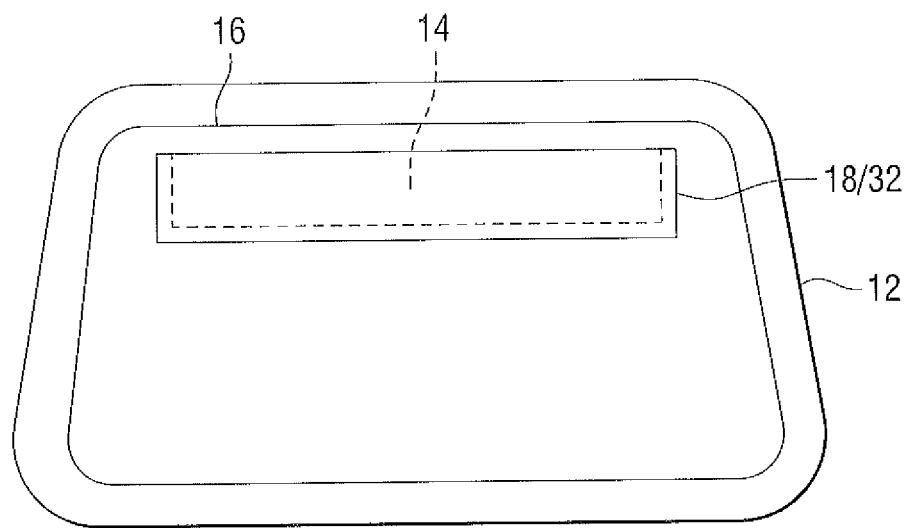
FIG. 4 is a plan view (not to scale) of the bus bar system of FIG. 2.
Figure 5:
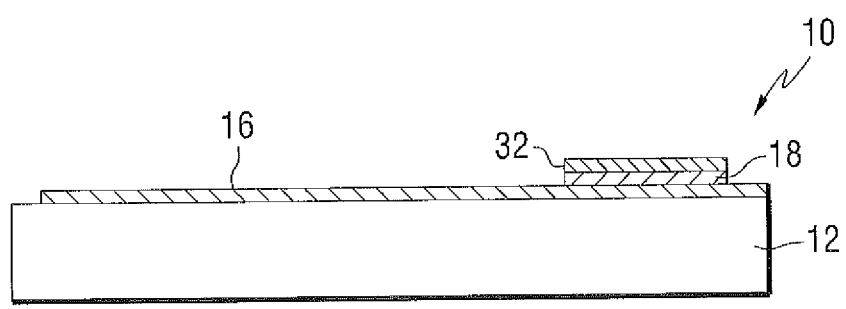
FIG. 5 is a side (not to scale) of an additional bus bar system of the invention.

Another bus bar system 30 of the invention is shown in FIG. 2. This system 30 is similar to the system 10 shown in FIG. 1 but also includes a conductive metal foil 32 applied over at least a portion of the isotropically conductive adhesive 18, e.g., an isotropically conductive tape. The foil 32 provides an additional conductive path and also provides additional mechanical and/or chemical barrier properties to the underlying components. Examples of metallic foils useful for the invention include, but are not limited to, tin-plated copper, copper, aluminum, silver, stainless steel, and nickel, just to name a few. For example, a piece of metallic foil can be adhered to a piece of isotropically conductive tape. The foil covered tape can be cut to desired dimensions. The foil covered tape can be cut to be slightly larger than the dimensions of the bus bar to which it will be attached. For example, the foil covered tape can be cut to be about 0.1 cm to 0.8 cm longer and/or wider than the bus bar, for example 0.1 cm to 0.5 cm, such as 0.1 cm to 0.3 cm, such as 0.2 cm (0.09 inch). The foil covered tape can be positioned over the bus bar with the outer edge of the foil aligned with the outer edge of the bus bar (as shown in FIG. 4). Alternatively, the foil covered tape can extend beyond the outer edge of the bus bar 14 (as shown in FIG. 2).

Figure 3:
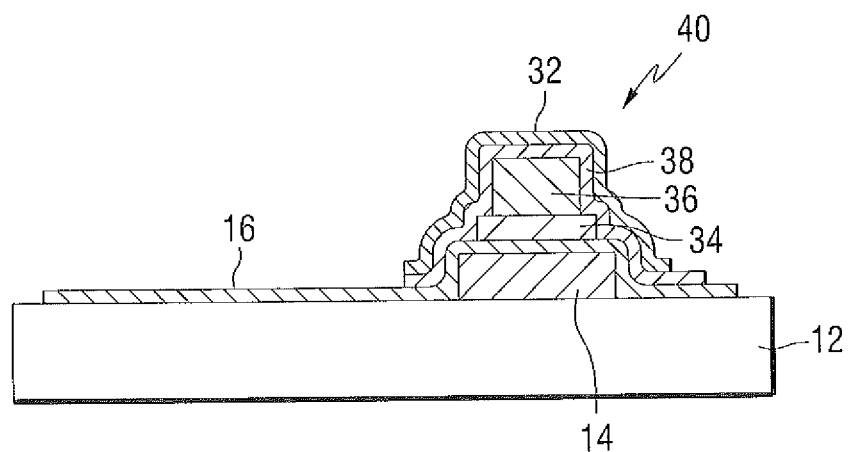
FIG. 3 is a side, sectional view (not to scale) of a further bus bar system of the invention.

Another bus bar system 40 of the invention is shown in FIG. 3. In this embodiment 40, the bus bar 14 and conductive coating 16 are applied in conventional manner. However, in this embodiment, a first isotropically conductive tape 34 is applied over at least a portion of the coating 16 on the bus bar 14. A conductive braid 36 is adhered to the first conductive tape 34. This mechanical and electrical connection can be supplemented by a secondary adhesive, taking advantage of the first conductive tape 34 to "fixture" or hold the braid 36 in the desired location. The braid 36 can be any conventional conductive braid, such as a tin plated conductive copper or silver containing braid. Another isotropically conductive tape 38 is applied over the first conductive tape 34 and braid 36. The first and second isotropically conductive adhesives (e.g., tapes) can be the same or different. A metallic foil 32 is adhered to the second conductive tape 38. This system provides additional advantages over those shown in FIGS. 1 and 2. For example, the braid 36 acts as a redundant carrier for electrical current to the conductive coating 16.

As will be appreciated by one skilled in the art, after formation of the bus bar system, the substrate 12 can be laminated to another substrate by a polymeric interlayer to form a laminated transparency.

It will be readily appreciated by those skilled in the art that modifications may be made to the invention without departing from the concepts disclosed in the foregoing description. Accordingly, the particular embodiments described in detail herein are illustrative only and are not limiting to the scope of the invention, which is to be given the full breadth of the appended claims and any and all equivalents thereof.

The invention claimed is:

1. A bus bar system, comprising:
a non-conductive substrate having a major surface and a periphery;
a conductive bus bar located over at least a portion of the major surface, the bus bar having a top, a bottom, a first side facing the periphery of the substrate and defining an outer edge, and a second side facing opposite the first side away from the periphery and defining an inner edge;
an electrically conductive coating located over at least a portion of the bus bar and the major surface; and
a flexible isotropically conductive adhesive located over at least a portion of the bus bar top and extending over the inner edge of the bus bar and in contact with the conductive coating on the major surface.

2. The system of claim 1, wherein the substrate is selected from the group consisting of glass and plastic.

3. The system of claim 1, wherein the bus bar comprises a ceramic bus bar.

4. The system of claim 1, wherein the conductive coating is selected from the group consisting of indium tin oxide and a coating having at least one metallic layer between dielectric layers.

5. The system of claim 1, wherein the isotropically conductive adhesive is selected from the group consisting of a conductive tape and a conductive film.

6. The system of claim 1, further including a metallic foil adhered to the isotropically conductive adhesive.

7. The system of claim 1, wherein the substrate is selected from the group consisting of glass and plastic, wherein the bus bar comprises a ceramic bus bar, wherein the conductive coating is selected from the group consisting of indium tin oxide and a functional coating having at least one metallic layer, wherein the isotropically conductive adhesive is selected from the group consisting of a conductive tape and a conductive film, and a metallic foil is adhered to the isotropically conductive adhesive.

8. The system of claim 1, wherein the substrate is selected from the group consisting of glass and plastic, wherein the bus bar comprises a ceramic bus bar, wherein the conductive coating comprises indium tin oxide, wherein the isotropically conductive adhesive is a conductive tape, and a metallic foil is adhered to the tape.

9. A bus bar system comprising;
a non-conductive substrate having a major surface;
a bus bar located over at least a portion of the major surface and having a top and an inner edge;
a conductive coating located over at least a portion of the bus bar and major surface;
a first isotropically conductive flexible tape located over at least a portion of the conductive coating overlying the top of the bus bar;
a conductive braid located over the first conductive tape;
a second isotropically conductive flexible tape located over at least a portion of the braid and first conductive tape and extending over the inner edge of the bus bar and in contact with the conductive coating on the major surface; and
a conductive metallic foil located over at least a portion of the second isotropically conductive tape, the braid, and the first isotropically conductive tape, with the metallic foil extending over the inner edge of the bus bar and in contact with the second isotropically conductive flexible tape over the major surface.

10. The system of claim 9, wherein the substrate is selected from the group consisting of glass and plastic.

11. The system of claim 9, wherein the bus bar comprises a ceramic bus bar.

12. The system of claim 9, wherein the conductive coating is selected from the group consisting of indium tin oxide and a coating having at least one metallic layer between dielectric layers.

13. The bus bar system of claim 1, wherein the flexible isotropically conductive adhesive includes a first portion over the top of the bus bar and a second portion extending beyond the inner edge of the bus bar, wherein the second portion is angled with respect to the first portion.

14. A bus bar system for a vehicle transparency, comprising:
a non-conductive substrate having a major surface and an outer periphery;
a conductive bus bar located over at least a portion of the major surface, the bus bar having a top, a bottom, a first side facing the periphery of the substrate and defining an outer edge, and a second side facing opposite the first side away from the peripheral edge and defining an inner edge;
an electrically conductive coating formed over at least a portion of the bus bar and the major surface;
a flexible isotropically conductive adhesive tape located over at least a portion of the bus bar and including a first portion over the bus bar top, a second portion extending beyond the inner edge of the bus bar and in contact with the conductive coating, and a third portion extending beyond the outer edge of the bus bar and in contact with the conductive coating; and
a metallic foil adhered to the adhesive tape over the bus bar, the metallic foil including a first portion over the bus bar top, a second portion extending beyond the inner edge of the bus bar and in contact with the second portion of the conductive adhesive tape extending beyond the inner edge of the bus bar, and a third portion extending beyond the outer edge of the bus bar and in contact with the third portion of the conductive adhesive tape extending beyond the outer edge of the bus bar.

15. The bus bar system of claim 14, wherein the second portion and the third portion of the conductive adhesive tape are angled with respect to the first portion of the conductive adhesive tape.

16. The bus bar system of claim 14, wherein the second portion and the third portion of the metallic foil are angled with respect to the first portion of the metallic foil.

* * * * *